US012713704B2

(12) United States Patent
Ritter et al.

(10) Patent No.: US 12,713,704 B2
(45) Date of Patent: Aug. 18, 2026

(54) SEMICONDUCTOR DEVICE AND ESD PROTECTION DEVICE COMPRISING THE SAME

(71) Applicant: NEXPERIA B.V., Nijmegen (NL)

(72) Inventors: Hans-Martin Ritter, Nijmegen (NL); Stefan Seider, Nijmegen (NL)

(73) Assignee: NEXPERIA B.V., Nijmegen (NL)

( * ) Notice: Subject to any disclaimer, the term of this patent is extended or adjusted under 35 U.S.C. 154(b) by 796 days.

(21) Appl. No.: 17/877,175

(22) Filed: Jul. 29, 2022

(65) Prior Publication Data

US 2023/0034808 A1 Feb. 2, 2023

(30) Foreign Application Priority Data

Jul. 29, 2021 (EP) .................................... 21188591

(51) Int. Cl.
*H10D 89/60* (2025.01)

(52) U.S. Cl.
CPC .................................. *H10D 89/60* (2025.01)

(58) Field of Classification Search
CPC .... H10D 89/60; H10D 89/713; H10D 89/911; H10D 89/711
USPC .......................................................... 257/173
See application file for complete search history.

(56) References Cited

U.S. PATENT DOCUMENTS 5,182,220 A 1/1993 Ker et al.
6,479,869 B1 * 11/2002 Hiraga ................ H10D 84/212 257/350
7,057,867 B1 6/2006 Vashchenko et al.
9,673,607 B2 6/2017 Reinprecht et al.
2002/0097544 A1 7/2002 Vashchenko et al.
2012/0008242 A1 1/2012 Salcedo
2016/0056231 A1 * 2/2016 Singh .................. H10D 64/231 438/356
2016/0372921 A1 * 12/2016 Lai ...................... H10D 89/611

FOREIGN PATENT DOCUMENTS

WO 2014032965 A1 3/2014

OTHER PUBLICATIONS

Extended European Search Report for corresponding European application EP21188591.8, 8 pages dated Jan. 14. 2022.

* cited by examiner

*Primary Examiner* — Norman D Richards
*Assistant Examiner* — Laura M Dykes
(74) *Attorney, Agent, or Firm* — Ruggiero McAllister & McMahon LLC

(57) ABSTRACT

An electrostatic discharge protection device is provided. In particular, the present disclosure relates to a semiconductor device that is particularly useful for ESD protection purposes. The semiconductor device further includes a second electronic component integrated on the semiconductor body and being spaced apart from the first electronic component, the second electronic component includes a first secondary region of the first charge type and a second secondary region of the second charge type arranged adjacent to the first secondary region, and the second secondary region is electrically connected to the second device terminal; and a first capacitive element, a first terminal thereof being electrically connected to the second primary region, and a second terminal thereof being electrically connected to the first secondary region.

19 Claims, 11 Drawing Sheets

SEMICONDUCTOR DEVICE AND ESD PROTECTION DEVICE COMPRISING THE SAME

CROSS REFERENCE TO RELATED APPLICATION

This application claims the benefit under 35 U.S.C. § 119(a) of European Application No. 21188591.8 filed Jul. 29, 2021, the contents of which are incorporated by reference herein in their entirety.

BACKGROUND OF THE DISCLOSURE

1. Field of the Disclosure

The present disclosure relates to a semiconductor device. More in particular, the present disclosure relates to a semiconductor device that is particularly useful for ESD protection purposes.

2. Description of the Related Art

Electronic devices and circuits may be subject to electrostatic discharge (ESD) events, for example due to close contact between said device (or circuit) with a differently-charged object, or due to a breakdown of a dielectric between said device (or circuit) and said object, resulting in a sudden flow of electricity. Excessive currents due to a sudden discharge from an ESD event can cause significant and/or permanent damage to sensitive electronic devices.

ESD protection devices can be used to prevent such damage to electronic devices or circuits. For example, a dedicated ESD protection device can be electrically connected in parallel to the electronic device to shunt the ESD current. An exemplary configuration is shown in FIG. 1, in which an ESD protection device 10 is connected in between, for example, a signal line 21 and a rail line 22 of an electronic circuit 20, such as an integrated circuit (IC). Alternatively, ESD protection device 10 can be integrated with electronic circuit 20 into a single IC.

Generally, the ESD protection device or circuit has a relatively high current handling capability, and prevents or limits a current due to an ESD event from flowing through the sensitive electronic device(s) by allowing a substantial portion of said current to flow through the ESD protection device instead. At the same time, the ESD protection device should limit the voltages within the sensitive electronic device(s) or circuit(s) to sufficiently low levels to prevent damage to connected electronic device(s) or circuit(s) to be protected.

A bipolar junction transistor (BJT) in an open-base configuration, such as shown in FIG. 2, is frequently used in ESD protection devices. Here, the open-base configuration refers to the BJT being operated as a two-terminal device by leaving the base terminal of the BJT unconnected. Consequently, in operation, the base terminal of the BJT will be at a floating potential.

In FIG. 2, a BJT 11 in open-base configuration is connected in between a first terminal 12*a* and a second terminal 12*b*. First and second terminal 12*a*, 12*b* may for example correspond to terminals of ESD protection device 10 as shown in FIG. 1.

BJT 11 may be formed either symmetrically or asymmetrically. For a symmetrical BJT 11, the emitter and collector region thereof are identically or similarly doped such that BJT 11 operates substantially identically irrespective of the polarity of the ESD event. In that case, the emitter of BJT 11 may assume the role of the collector, and vice versa, depending on the polarity of the ESD event. Alternatively, if BJT 11 is formed asymmetrically, a performance of ESD protection device 10 may differ depending on the polarity of the ESD event.

The operation of ESD protection device 10 is as follows. During an ESD event, a voltage across first and second terminal 12*a*, 12*b* rises rapidly. Since the base terminal of BJT 11 is at a floating potential, its electrical potential will self-adjust during the ESD event. In particular, during an ESD event, the base-collector junction of BJT 11 will be reverse-biased, such that initially substantially no current can flow through BJT 11. Therefore, the base-emitter junction also cannot be forward-biased at this stage. This condition is ensured by the self-adjusting electrical potential of the base. In other words, as the voltage across the first and second terminal 12*a*, 12*b* increases (i.e., due to the ESD event), the voltage across the base-collector junction will also increase.

After some time, the voltage across the base-collector junction will exceed a breakdown voltage of said junction, resulting in an avalanche breakdown of said junction. Since a current can now flow through the base-collector junction, the base-emitter junction will become forward-biased due to the self-adjusting electrical potential of the base, thereby enabling a current flow between first and second device terminal 12*a*, 12*b* through BJT 11. At this point, the emitter of BJT 11 starts injecting charge carriers into the base. Once the charge carriers from the emitter reach the base-collector avalanche region, BJT 11 will enter a 'snapback' mode, and the voltage across BJT 11 will decrease. At this point, BJT 11 switches to a low-Ohmic on-state, in which state a substantial current from the ESD event can be accommodated.

A problem associated with the known ESD protection device is that the open-base BJT may not switch sufficiently quickly into its low-Ohmic on-state to prevent damages to the electronic circuit to be protected. Prior to the BJT being in its low-Ohmic on-state, the potential difference across the terminals of the ESD protection device due to the ESD event may be substantial and may cause significant and/or permanent damage to the electronic circuit to be protected.

The turn-on time of the known ESD protection device may be particularly slow when using low-capacitance BJTs having a relatively large and lowly doped base region. This is because a substantial number of charge carriers must be injected from the emitter into the relatively large base before the BJT can switch to its low-Ohmic on-state. On the other hand, using a BJT with a higher associated capacitance is not preferred, as this would increase the capacitive loading of the ESD protection device on the electronic circuit to be protected, which may adversely affect the performance of said electronic circuit.

SUMMARY

It is an object of the present disclosure to provide a semiconductor device for which the abovementioned problems are prevented or limited.

This object is achieved with the semiconductor device according to claim 1. The semiconductor device has a first device terminal and a second device terminal, and comprises a semiconductor body having a first electronic component integrated thereon. The first electronic component comprises a first primary region of a first charge type electrically connected to the first device terminal, a second primary region of a second charge type arranged adjacent to the first primary region, and a third primary region of the first charge type arranged adjacent to the second primary region and being electrically connected to the second device terminal.

The semiconductor device according to the present disclosure is characterized in that it further comprises a second electronic component integrated on the semiconductor body and being spaced apart from the first electronic component, the second electronic component comprising a first secondary region of the first charge type and a second secondary region of the second charge type arranged adjacent to the first secondary region, wherein the second secondary region is electrically connected to the second device terminal. Furthermore, the semiconductor device according to the present disclosure comprises a first capacitive element, a first terminal thereof being electrically connected to the second primary region, and a second terminal thereof being electrically connected to the first secondary region.

The first electronic component as described above may form a BJT, and the second electronic component may form a diode.

The turn-on time of the open-base BJT known in the art can at least partially be attributed to the fact that the emitter is only able to inject charge carriers into the base once avalanche breakdown of the base-collector junction is initiated. This is because the base-emitter junction cannot be forward-biased until a current flow through the BJT, due to avalanche breakdown at the base-collector junction, is possible. In other words, a two-step process is required to enable the BJT to switch into its low-Ohmic on-state. First, a certain amount of time is required to build up a potential difference across the base-collector junction and thereby initiate avalanche breakdown at the base-collector junction. Subsequently, a certain amount of time is needed to inject charge carriers from the emitter into the base of the BJT.

The first capacitive element in combination with the second electronic component according to the present disclosure enables a current flow through the junction between the first primary region and the second primary region, even though no avalanche breakdown is initiated at the junction between the second primary region and the third primary region. With this current flow, charge carriers are injected from the first primary region (e.g., the emitter) into the second primary region (e.g., the base) before avalanche breakdown occurs in the first electronic component. Furthermore, the first capacitive element ensures that the second primary region and the first secondary region are at a floating potential.

Prior to an ESD event, none of the junctions between adjacent regions of the semiconductor device are forward-biased. The second primary region and the first secondary region, between which the first capacitive element is coupled, are both at a floating potential. Consequently, the electrical potential at said regions will be self-adjusting.

During an ESD event, the electrical potential across the first and second device terminal rises rapidly. During this voltage rise, the floating electrical potential of the second primary region and the first secondary region will self-adjust. After some time, the voltage across the junction between the first primary region and the second primary region, as well as the voltage across the junction between the first secondary region and the second secondary region, will be sufficient to forward-bias said junctions. This enables a current flow from one of the first and second device terminal to the other through said junctions and through the first capacitive element.

With the current flow via the first capacitive element, charge carriers are injected into the second primary region and the first secondary region even before avalanche breakdown at the junction between the second primary region and the third primary region occurs. In other words, the second primary region can be at least partially filled with charge carriers already prior to the avalanche breakdown. Once the voltage across the junction between the second primary region and the third primary region exceeds the breakdown voltage, the first electronic component can switch to its low-Ohmic on-state significantly faster with respect to a conventional open-base BJT. In particular, if the second primary region is already substantially filled with charge carriers prior to the avalanche breakdown, then the first electronic component can enter the snapback mode substantially immediately after avalanche breakdown is initiated, thus significantly reducing the turn-on time. In the low-Ohmic on-state, the first electronic component is able to accommodate the sudden discharge current from the ESD event to thereby protect the electronic circuit to which it is connected. In addition, since the second primary region is filled with charge carriers at an earlier moment during the ESD event, a peak or 'overshoot' voltage due to said ESD event is reduced compared to the conventional open-base BJT. As a result, the semiconductor device according to the present disclosure also protects an electronic circuit from excessive voltage levels due to the ESD event.

The amount of charge that the first capacitive element is able to store is proportional to its capacitance value. In order to substantially fill the second primary region with charge carriers, the first capacitive element may have a large enough capacitance such that the charge that can be stored on the first capacitive element can be made equal to or greater than the charge required to substantially fill the second primary region.

If the second primary region is already substantially filled with charge carriers prior to the avalanche breakdown, the snapback effect occurs substantially immediately after avalanche breakdown occurs, such that the first electronic component enters its low-Ohmic on-state. However, it will be appreciated by a person skilled in the art that the turn-on time of the first electronic component is also reduced for smaller capacitance values. In particular, even if the second primary region is not substantially filled with charge carriers prior to avalanche breakdown, the turn-on time of the first electronic component is still reduced, since the number of charge carriers that must be injected after avalanche breakdown occurs is reduced.

During normal operation of the electronic circuit to be protected, the junction between the first secondary region and the second secondary region is not forward-biased. Consequently, the associated junction capacitance thereof is relatively small. Since the first capacitive element is connected in series with the second electronic component comprising said first and second secondary region, the combined effective capacitance value may be dominated by this junction capacitance during normal operation, such that the capacitive loading of the semiconductor device on the electronic circuit to be protected is reduced during normal operation.

The semiconductor device according to the present disclosure as described above provides a faster turn-on time only in one direction, and the directionality depends on the selected dopant type for the first and second charge type. For example, if the first charge type is p-type and the second charge type is n-type, the turn-on time is improved for a voltage rise at the first device terminal with respect to the second device terminal. On the other hand, if the first charge type is n-type and the second charge type is p-type, the turn-on time is improved for a voltage rise at the second device terminal with respect to the first device terminal.

However, a bidirectional semiconductor device is also envisaged. To this end, the semiconductor device may further comprise a third electronic component integrated on the semiconductor body and being spaced apart from the first electronic component and the second electronic component. The third electronic component may comprise a first tertiary region of the first charge type and a second tertiary region of the second charge type arranged adjacent to the first tertiary region. The second tertiary region may be electrically connected to the first device terminal. The third electronic component may for example form a diode.

Furthermore, the first tertiary region may be electrically connected to the second terminal of the first capacitive element. Alternatively, the semiconductor device may further comprise a further first capacitive element having a first terminal thereof electrically connected to the second primary region and having a second terminal thereof electrically connected to the first tertiary region.

In the above embodiment, the second electronic component in combination with the first capacitive element enables the first electronic component to have a faster turn-on time in one direction (i.e., for a particular ESD event polarity), while the third electronic component in combination with the first capacitive element enables a faster turn-on time of the first electronic component in the other direction.

Instead of including a third electronic component to obtain a bidirectional semiconductor device, the second electronic component may further comprise a third secondary region of the second charge type arranged adjacent to the first secondary region, wherein the third secondary region is electrically connected to the first device terminal. The second electronic component may for example form a BJT.

The junction between the first secondary region and the second secondary region effectively forms a diode for enabling a faster turn-on time of the first electronic component in one particular direction, while the junction between the first secondary region and the third secondary region effectively forms a diode for enabling a faster turn-on time of the first electronic component in the other direction. Furthermore, the junction between the first primary region and the second primary region effectively forms a diode for enabling a faster turn-on time of the second electronic component in one particular direction, and the junction between the second primary region and the third primary region effectively forms a diode for enabling a faster turn-on time of the second electronic component in the other direction. This enables a symmetric operation in which both the first electronic component and the second electronic component switch to a low-Ohmic on-state after the snapback effect occurs for the respective electronic components, regardless of the polarity of the ESD event. More in particular, a current can flow through part of the first and second electronic component via the first capacitive element, thereby injecting charge carriers into the second primary region and the first secondary region (e.g., the base regions) of the first and second electronic component, respectively, even though avalanche breakdown in the first and second electronic component did not yet occur.

The second primary region may comprise a first primary sub-region arranged adjacent to the first primary region, and a second primary sub-region arranged in between said first primary sub-region and the third primary region. A dopant concentration of the first primary sub-region may be less than that of the second primary sub-region, the first primary region and the third primary region. Furthermore, the first secondary region may comprise a first secondary sub-region arranged adjacent to the third secondary region, and a second secondary sub-region arranged in between said first secondary sub-region and the second secondary region. A dopant concentration of the first secondary sub-region may be less than that of the second secondary sub-region, the second secondary region and the third secondary region. The first capacitive element may be electrically connected between at least one of the first and second primary sub-region and at least one of the first and second secondary sub-region.

In the above embodiment, the junction between the first primary region and the first primary sub-region will have a relatively low associated capacitance value, while the junction between the second primary sub-region and the third primary region will have a relatively low associated breakdown voltage. Similarly, the junction between the third secondary region and the first secondary sub-region will have a relatively low associated capacitance value, while the junction between the second secondary sub-region and the second secondary region will have a low associated breakdown voltage. This reduces the capacitive loading of the semiconductor device on the electronic circuit that is to be protected. In addition, due to the reduced breakdown voltage for the abovementioned junctions, the time required for avalanche breakdown to occur is reduced, resulting in a further decrease in the turn-on time of the semiconductor device. In other words, a trade-off between breakdown voltage and junction capacitance of the first and second electronic component is improved.

In the above embodiment, the first electronic component and the second electronic component are asymmetrical. Consequently, during an ESD event, due to the difference in breakdown voltage of respective junctions of the first and second electronic component, one of the first electronic component and the second electronic component will switch to its low-Ohmic on-state first, depending on the polarity of the ESD event and on the selected dopant type for the first and second charge type. For example, the first charge type may be n-type, and the second charge type may be p-type. Then, if an ESD event causes the voltage at the first device terminal to increase with respect to the second device terminal, then the resulting ESD current may flow substantially only through the second electronic component after turn-on. On the other hand, if the rising voltage occurs at the second device terminal, then the ESD current may flow substantially only through the first electronic component after turn-on. Additionally, the other of the first and second electronic component may switch later, or may not switch at all, depending on the selected dopant concentrations for the various regions of the first and second electronic component. For example, after the first electronic component turns on, the voltage across the junction between the first and third secondary region may not be large enough for avalanche breakdown to occur at said junction. In that case, the second electronic component may not turn on during the same ESD event.

The second primary region may further comprise a third primary sub-region arranged in between the second primary sub-region and the third primary region. A dopant concentration of the third primary sub-region may be less than that of the second primary sub-region and the third primary region. Furthermore, the first secondary region may further comprise a third secondary sub-region arranged in between the second secondary sub-region and the second secondary region. A dopant concentration of the third secondary sub-region may be less than that of the second secondary sub-region and the second secondary region.

Having a highly doped region arranged in between lowly doped regions in the second primary region and/or the first secondary region prevents or at least limits the occurrence of punch-through during operation. For example, during operation, the depletion region in the second primary region and/or the first secondary region may not extend across the said region due to the highly doped region. At the same time, a junction capacitance between, for example, the first and second primary region and between the second and third primary region is smaller due to lowly doped regions in said second primary region being adjacent to said first and third primary region, respectively.

The first electronic component may further comprise a fourth primary region of the second charge type arranged adjacent to the third primary region, wherein the third primary region is electrically connected to the second device terminal through the fourth primary region. In addition, the semiconductor device may further comprise a second capacitive element, a first terminal thereof being electrically connected to the third primary region, and a second terminal thereof being electrically connected to the second secondary region. The second secondary region may be electrically connected to the second device terminal through the second capacitive element, the third primary region and the fourth primary region. The first electronic component may for example form a thyristor or a silicon controlled rectifier, SCR. Furthermore, the semiconductor device may comprise a first resistor electrically connected between the first device terminal and the second primary region, and/or a second resistor electrically connected between the second device terminal and the third primary region.

In the above embodiment, each of the second primary region, the third primary region, the first secondary region and the second secondary region are at a floating electrical potential. Similarly to the previously described embodiments, once the junction between the first primary region and second primary region, the junction between the first secondary region and the second secondary region, and the junction between the third primary region and the fourth primary region become forward-biased, a current path between the first and second device terminal is obtained through said junctions and through the first and second capacitive element. Charge carriers are then injected from the first primary region into the second primary region, and from the fourth primary region into the third primary region, even though avalanche breakdown has not yet occurred at the junction between the second primary region and the third primary region. As a result, the second primary region and the third primary region can be substantially filled with charge carriers already prior to the avalanche breakdown. The first electronic component can then switch to its low-Ohmic on-state once the avalanche breakdown occurs.

The second electronic component may further comprise a third secondary region of the second charge type arranged adjacent to the first secondary region. The third secondary region may be electrically connected to the first device terminal.

Additionally or alternatively, the second electronic component may further comprise a fourth secondary region of the first charge type arranged adjacent to the second secondary region. The fourth secondary region may be electrically connected to the second device terminal.

In so far as the second electronic component comprises only one of the third secondary region and the fourth secondary region, the second electronic component may for example form a BJT. If the second electronic component comprises both the third secondary region and the fourth secondary region, then the second electronic component may for example form a thyristor or SCR. In the latter case, the semiconductor device may further comprise a third resistor electrically connected between the first device terminal and the first secondary region, and/or a fourth resistor electrically connected between the second device terminal and the second secondary region.

In the latter case, the semiconductor device will exhibit a reduced turn-on time irrespective of the polarity of the ESD event. In particular, the ESD current will flow through one of the first and second electronic component depending on the polarity of the ESD event and the selected dopant type for the first and second charge type. For example, if the first charge type is p-type and the second charge type is n-type, then the ESD current will flow through the first electronic component, which will be in a low-Ohmic state after being turned on. On the other hand, if the first charge type is n-type and the second charge type is p-type, the ESD current will flow through the second electronic component, which will be in a low-Ohmic state after being turned on.

The semiconductor body may comprise a semiconductor substrate and an epitaxial layer on top of said semiconductor substrate. The first electronic component, the second electronic component and, if applicable, the third electronic component may be arranged in the epitaxial layer of the semiconductor body. Additionally or alternatively, the first charge type may correspond to a p-type or n-type doping, and wherein the second charge type may correspond to an n-type or p-type doping, respectively. Additionally or alternatively, respective regions corresponding to the first electronic component, the second electronic component and/or, if applicable, the third electronic component may be ion-implanted regions. Additionally or alternatively, the semiconductor body may be based on one of silicon, Si, silicon carbide, SiC, gallium nitride, GaN, and gallium arsenide, GaAs, technology. Additionally or alternatively, the first capacitive element and/or, if applicable, the further first capacitive element and/or the second capacitive element may comprise a metal oxide semiconductor, MOS, capacitor.

It will be appreciated by a person skilled in the art that various dopant concentrations can be selected for the various regions among the regions of the first electronic component and the second electronic component. As an example only, in the embodiment wherein the first and second electronic component both comprise a BJT, a dopant concentration of the first and third primary region, and of the second and third secondary region, may lie in the range between 1e18-1e20, and a dopant concentration of the second primary region and the first secondary region may lie in the range between 1e15-1e18. Furthermore, if the second primary region and first secondary region each comprise a first and second sub-region, then a dopant concentration of the first primary and/or secondary sub-region may lie in the range between 1e13-1e16, and a dopant concentration of the second primary and/or secondary sub-region may lie in the range between 1e15-1e18. Nevertheless, the present disclosure is not limited to these dopant concentration ranges, and adjustments can be made accordingly.

Furthermore, the semiconductor device may comprise metal contact elements, such as those formed in a metal layer on top of the semiconductor body, for electrically contacting one or more respective regions of the first and second electronic component and providing external electrical access to said regions. To this end, a low-Ohmic contact between various regions of the first and second electronic component and such a metal connection element may be provided by providing said regions with a highly doped contact sub-region adjacent to said metal connections, as will be appreciated by those skilled in the art. The highly doped contact sub-region may for example have a dopant concentration in a range of 1e18-1e20.

According to another aspect of the present disclosure, an ESD protection device is provided that is configured to be electrically connected to an electronic circuit and to protect said electronic circuit from ESD events. The ESD protection device comprises one or more semiconductor devices according to the present disclosure as defined above, and is preferably a packaged device.

According to yet another aspect of the present disclosure, a device is provided that comprises an electronic circuit integrated on a semiconductor body, and one or more semiconductor devices according to the present disclosure as defined above. The one or more semiconductor devices are integrated in the semiconductor body and are connected to the electronic circuit to protect said electronic circuit from ESD events. Preferably, the device is a packaged device.

BRIEF DESCRIPTION OF THE DRAWINGS

Next, the present disclosure will be described with reference to the appended drawings, wherein.

Hereinafter, reference will be made to the appended drawings. It should be noted that identical reference signs may be used to refer to identical or similar components.

DETAILED DESCRIPTION

Figure 1:
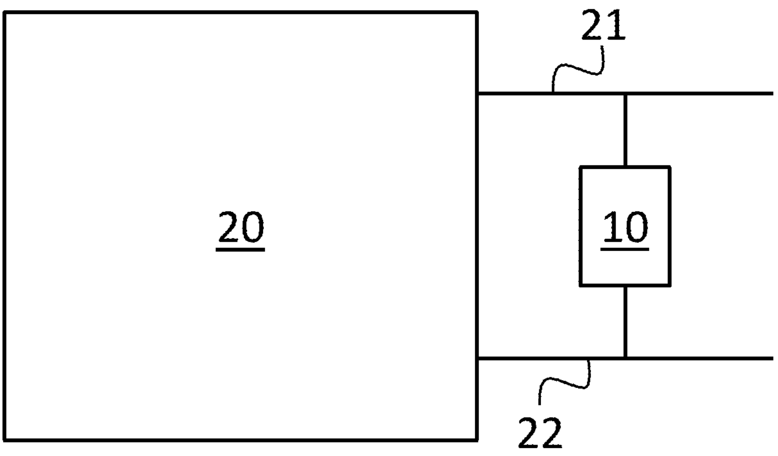
FIG. 1 is a schematic diagram including an ESD protection device connected to a circuit that is to be protected.
Figure 2:
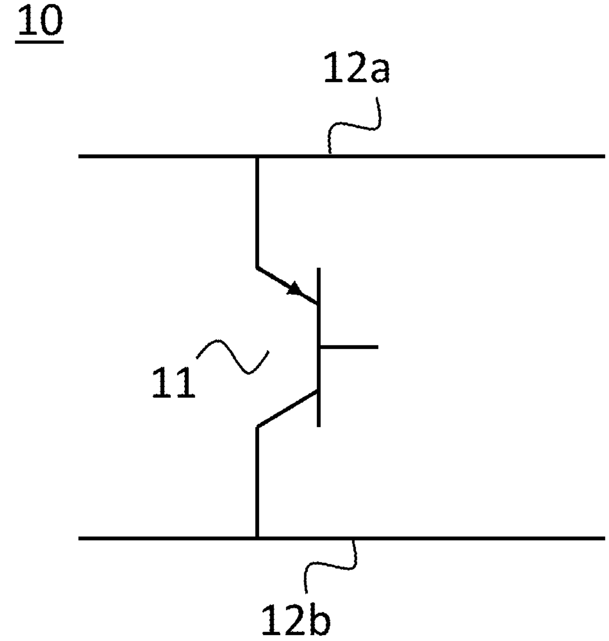
FIG. 2 is a schematic diagram of an ESD protection device known in the art.
Figure 3A:
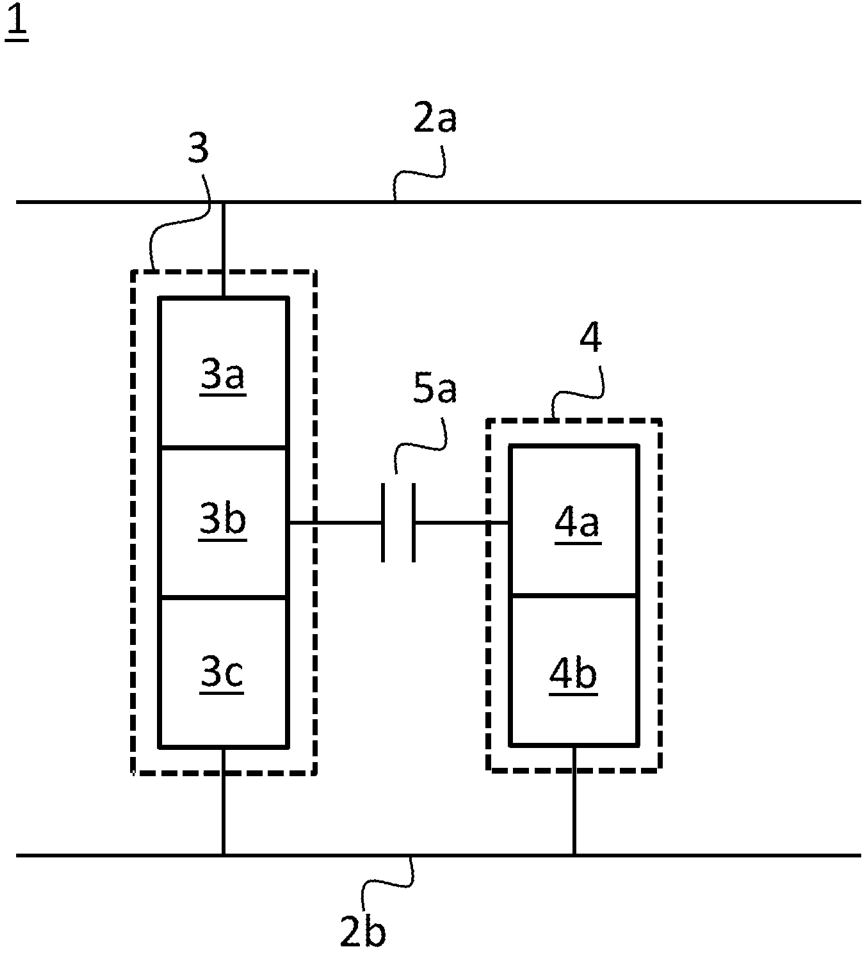
FIG. 3A is a schematic diagram of a semiconductor device according to an embodiment of the present disclosure.

In FIG. 3A, a semiconductor device 1 according to the present disclosure is shown. Semiconductor device 1 comprises a first electronic component 3, a second electronic component 4, and a first capacitive element 5*a* connected in between said first electronic component 3 and second electronic component 4.

More in particular, first electronic component 3 comprises a first primary region 3*a* of a first charge type (e.g., p-type), a second primary region 3*b* of a second charge type (e.g., n-type) and a third primary region 3*c* of the first charge type. Second electronic component 4 comprises a first secondary region 4*a* of the first charge type and a second secondary region 4*b* of the second charge type. Furthermore, first capacitive element 5*a* is connected in between second primary region 3*b* and first secondary region 4*a*. First primary region 3*a* is electrically connected to a first device terminal 2*a* of semiconductor device 1, while third primary region 3*c* and second secondary region 4*b* are electrically connected to a second device terminal 2*b* of semiconductor device 1. In this embodiment, first electronic component 3 forms a BJT, and second electronic component 4 forms a diode.

The first charge type may correspond to a p-type or n-type doping, and the second charge type may correspond to an n-type or p-type doping, respectively. For convenience, it is assumed hereinafter that the first charge type corresponds to a p-type doping, and that the second charge type corresponds to an n-type doping.

As previously explained, when an ESD event occurs, a potential difference across first and second device terminal 2*a*, 2*b* may increase. In order to prevent substantial damages to an electronic circuit to which semiconductor device 1 is connected, first electronic component 3 must be activated such that the ESD current can be discharged through first electronic component 3. In addition, an overvoltage resulting from the ESD event should be limited to protect said electronic circuit from being exposed to excessive voltage levels.

Second primary region 3*b* and first secondary region 4*a* are at a floating potential. Therefore, when the voltage at first device terminal 2*a* increases due to an ESD event, the electrical potential at second primary region 3*b* and first secondary region 4*a* will self-adjust until the junction between first and second primary region 3*a*, 3*b* and the junction between first and second secondary region 4*a*, 4*b* are both forward-biased. At this moment, a current will flow from first device terminal 2*a* to second device terminal 2*b* through said junctions and through first capacitive element 5*a*. Due to this current flow, charge carriers (i.e., holes) are injected from the p-type first primary region 3*a* into the n-type second primary region 3*b*, thereby filling second primary region 3*b* with charge carriers.

The electrical potential at second primary region 3*b* will continue increasing as the voltage at first device terminal 2*a* rises. After some time, a voltage across the junction between second and third primary region 3*b*, 3*c* will exceed a breakdown voltage of said junction, resulting in an avalanche breakdown occurring at said junction. The avalanche breakdown at this junction enables a current to flow from first device terminal 2*a* to second device terminal 2*b* through primary regions 3*a*-3*c* of first electronic component 3. However, since second primary region 3*b* is already substantially filled with charge carriers at this stage, once the avalanche breakdown is initiated, the snapback effect will occur substantially immediately, and first electronic component 3 switches to its low-Ohmic on-state. In this state, first electronic component 3 has the current handling capability to discharge the current resulting from the ESD event, thereby preventing or substantially limiting said current from flowing through the electronic circuit that is to be protected. In addition, since first electronic component 3 switches to its on-state soon after avalanche breakdown occurs, the overvoltage at first device terminal 2*a* is substantially limited.

Figure 3B:
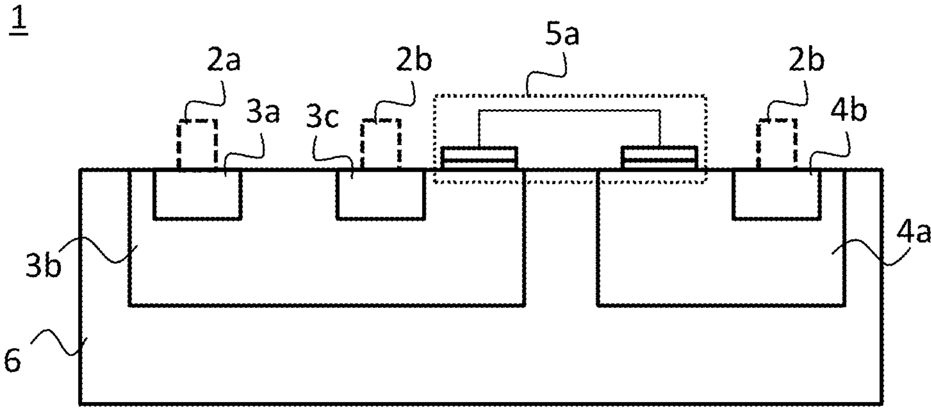
FIG. 3B is an exemplary cross-sectional view of the semiconductor device in FIG. 3A.

FIG. 3B illustrates an exemplary cross-sectional view of semiconductor device 1. More in particular, FIG. 3B shows primary regions 3*a*-3*c* of first electronic component 3 and secondary regions 4*a*, 4*b* of second electronic component 4 arranged in a semiconductor body 6. For example, semiconductor body 6 may comprise a semiconductor substrate having an epitaxial layer grown thereon, and the various regions of semiconductor device 1 may be arranged in the epitaxial layer.

First capacitive element 5*a* may be implemented in various ways. For example, referring to FIG. 3B, first capacitive element 5*a* may be formed using one or more metal-oxide-semiconductor (MOS) capacitors. In particular, a metal layer stacked on top of an oxide layer may be arranged on a surface portion of semiconductor body 6 above second primary region 3*b* and first secondary region 4*a* semiconductor body 6. However, the present disclosure is not limited thereto. First capacitive element 5*a* may for example instead be a discrete capacitor that is mounted on semiconductor body 6 and electrically connected in between second primary region 3*b* and first secondary region 4*a*.

As indicated in FIG. 3B with dashed lines, first device terminal 2*a* and second device terminal 2*b* may for example be formed using metal connections arranged in a metal layer on top of semiconductor body 6.

Hereinafter, embodiments of semiconductor device 1 shown in FIGS. 4, 5A, 5B, 5C and 6-9 may be formed in a manner similar to the structure shown in FIG. 3B, as will be appreciated by those skilled in the art. A cross-sectional view and a corresponding detailed description thereof may therefore be omitted.

Figure 4:
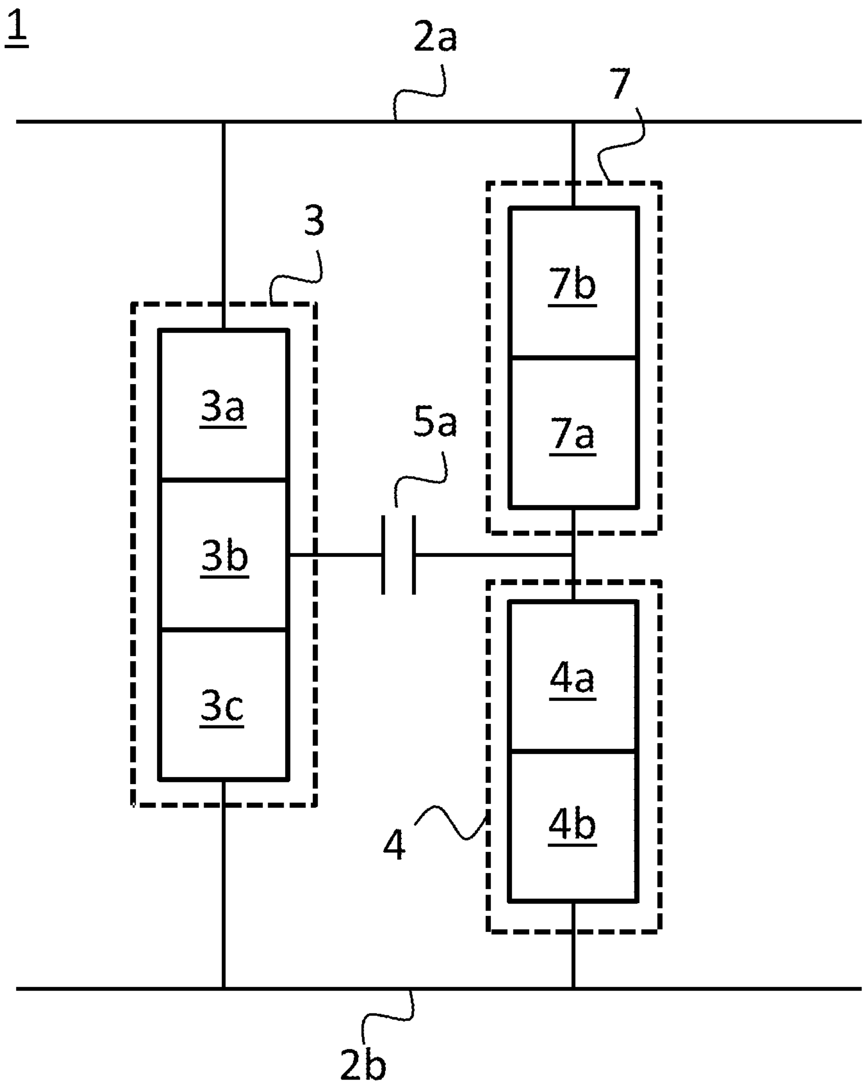
FIGS. 4, 5A, 5B, 5C and 6-9 are schematic diagrams of a semiconductor device according to various embodiments of the present disclosure.

FIG. 4 illustrates another embodiment of semiconductor device 1 according to the present disclosure. Semiconductor device 1 in FIG. 4 differs from that in FIG. 3 in that the device further comprises a third electronic component 7, comprising a first tertiary region 7*a* of the first charge type and a second tertiary region 7*b* of the second charge type.

As described above, second electronic component 4 in combination with first capacitive element 5*a* are included to improve a turn-on time of first electronic component 3 for one particular ESD event polarity. In particular, assuming the first charge type is p-type and the second charge type is n-type, the improved turn-on time of first electronic component 3 occurs for a voltage increase at first device terminal 2*a*. Similarly, third electronic component 7, as shown in FIG. 4, can be included to improve the turn-on time of first electronic component 3 for an opposite ESD polarity, i.e., a voltage increase at second device terminal 2*b*.

In FIG. 4, first capacitive element 5*a* is shown to be connected to both first secondary region 4*a* and first tertiary region 7*a*. However, other implementations are also envisaged. For example, first capacitive element 5*a* may be only connected between second primary region 3*b* and first secondary region 4*a*, and semiconductor device 1 may further comprise a further first capacitive element (not shown) that is connected between second primary region 3*b* and first tertiary region 7*a*.

Figure 5A:
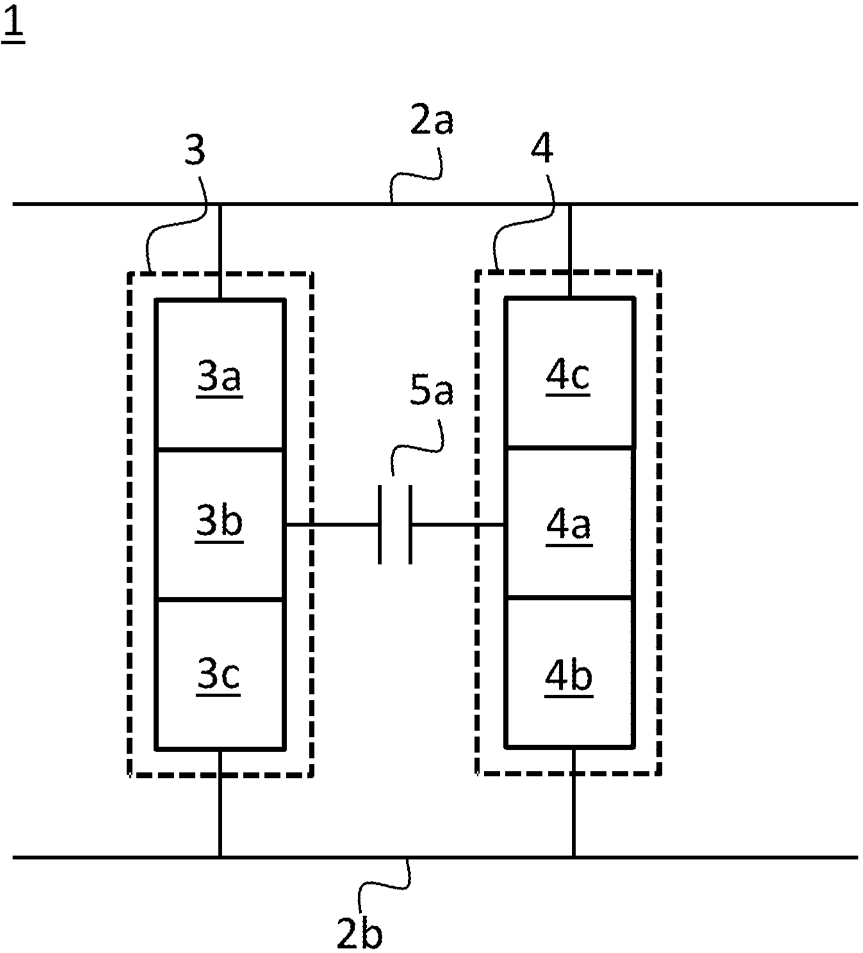

In FIG. 5A, another embodiment of semiconductor device 1 is shown. Alternative to the embodiment shown in FIG. 4, third electronic component 7 is not included, and second electronic component 4 further comprises a third secondary region 4*c* of the second charge type. In this embodiment, both first electronic component 3 and second electronic component 4 may form a BJT.

The operation of semiconductor device 1 shown in FIG. 5A is similar to that of semiconductor device 1 shown in FIG. 4. In particular, during an ESD event having a positive polarity with respect to first device terminal 2*a*, a current path between first and second device terminal 2*a*, 2*b* is provided through the PN-junction between first and second primary regions 3*a*, 3*b*, first capacitive element 5*a*, and the PN-junction between first and second secondary regions 4*a*, 4*b*. This current flow allows charge carriers to be injected into second primary region 3*b* and into first secondary region 4*a*. Then, once avalanche breakdown occurs at the junction between second and third primary region 3*b*, 3*c* and at the junction between second and third secondary region 4*b*, 4*c*, both first electronic component 3 and second electronic component 4 will enter their respective low-Ohmic on-state. Consequently, the current resulting from the ESD event can be discharged through first electronic component 3 and through second electronic component 4.

Figure 5B:
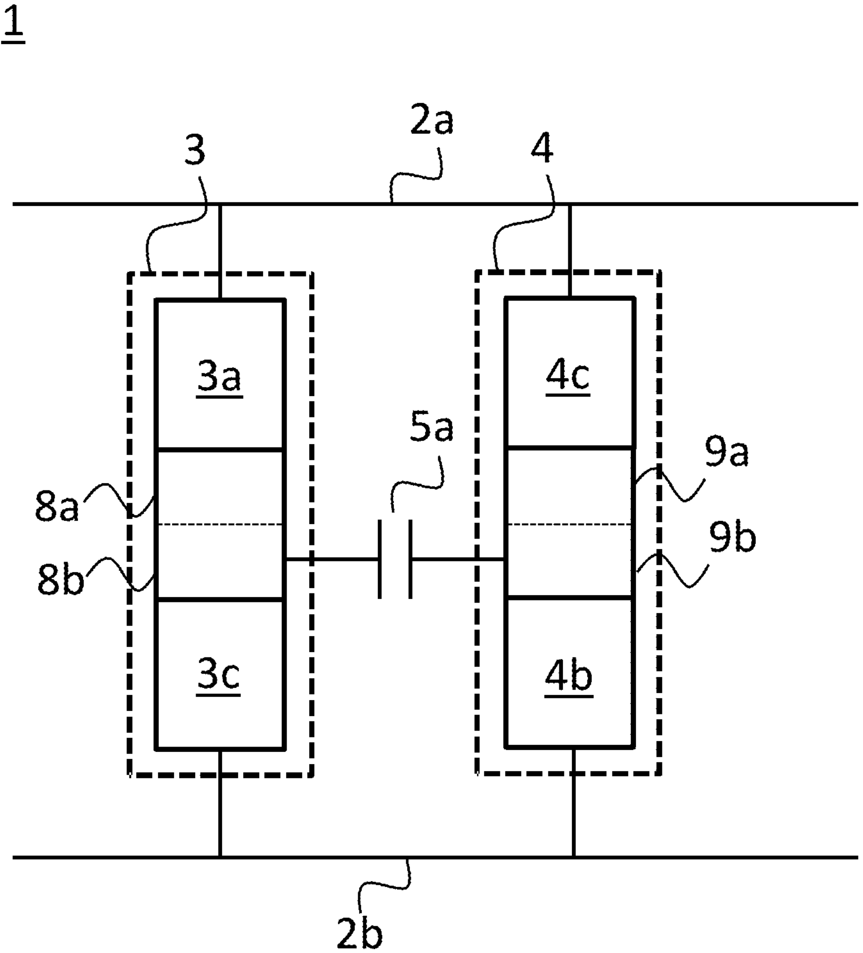
Figure 5C:
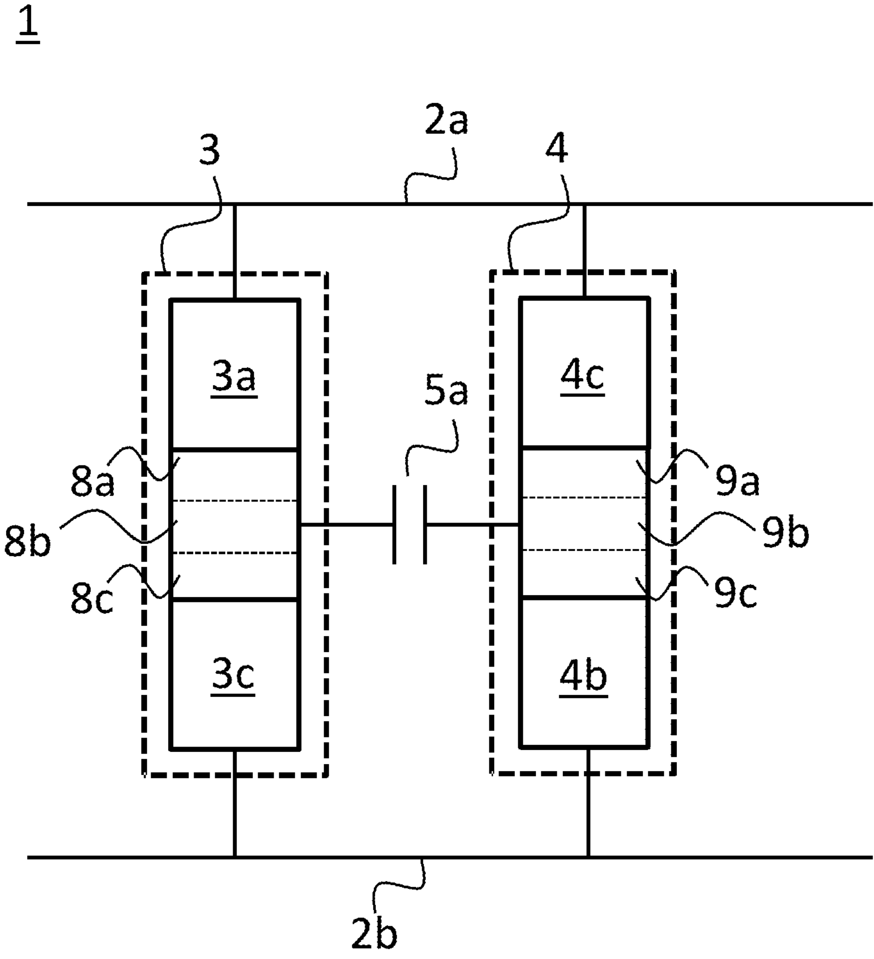

In FIGS. 5B and 5C, second primary region 3*b* and first secondary region 4*a* of semiconductor device 1 shown in FIG. 5A are divided into a plurality of sub-regions. For example, referring to FIG. 5B, second primary region 3*b* is divided into a first primary sub-region 8*a* and a second primary sub-region 8*b*, and first secondary region 4*a* is divided into a first secondary sub-region 9*a* and a second secondary sub-region 9*b*.

A dopant concentration of first primary sub-region 8*a* is less than a dopant concentration of second primary sub-region 8*b* and first primary region 3*a*. As a result, the PN-junction between first primary region 3*a* and first primary sub-region 8*a* has a relatively low associated capacitance value, while the PN-junction between second primary sub-region 8*b* and third primary region 3*c* has a relatively low breakdown voltage. Similarly, a dopant concentration of first secondary sub-region 9*a* is less than a dopant concentration of second secondary sub-region 9*b* and third secondary region 4*c*. As a result, the PN-junction between third secondary region 4*c* and first secondary sub-region 9*a* has a relatively low associated capacitance value, while the PN-junction between second secondary sub-region 9*b* and second secondary region 4*b* has a relatively low breakdown voltage.

Now referring to FIG. 5C, second primary region 3*b* further comprises a third primary sub-region 8*c*, and first secondary region 4*a* further comprises a third secondary sub-region 8*c*. A dopant concentration of third primary sub-region 8*c* is less than the dopant concentration of second primary sub-region 8*b* and third primary region 3*c*, and may be similar or equal to the dopant concentration of first primary sub-region 8*a*. Similarly, a dopant concentration of third secondary sub-region 9*c* is less than the dopant concentration of second secondary sub-region 9*b* and second secondary region 4*b*, and may be similar or equal to the dopant concentration of first secondary sub-region 9*a*. Each junction in first electronic component 3 and second electronic component 4 will then have a lower associated capacitance value.

Figure 6:
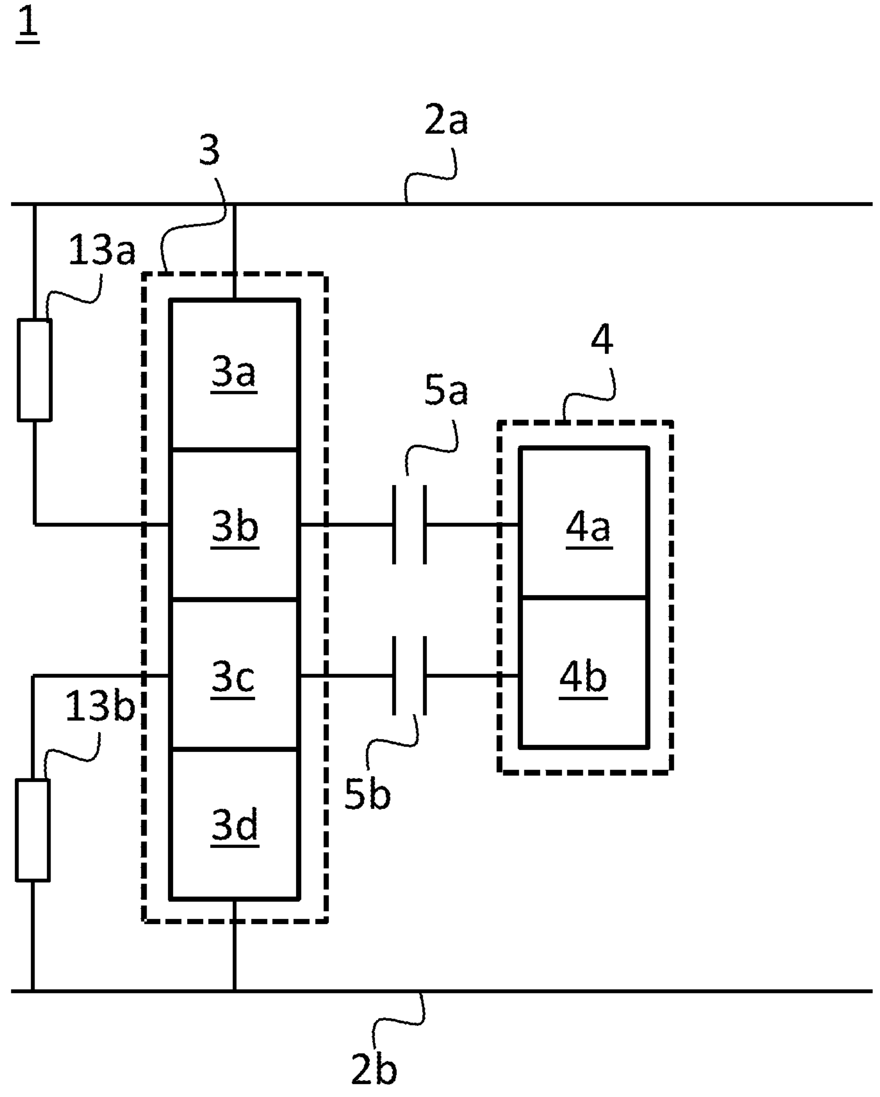

Another embodiment of semiconductor device 1 is shown in FIG. 6. In this embodiment, first electronic component 3 comprises a fourth primary region 3*d* of the second charge type that is electrically connected to second device terminal 2*b*. In addition, semiconductor 1 further comprises a second capacitive element 5*b* connected between third primary region 3*c* and second secondary region 4*b*. Second secondary region 4*b* is not directly electrically connected to second device terminal 2*b*, but is instead electrically connected thereto through second capacitive element 5*b*, third primary region 3*c* and fourth primary region 3*d*. In this embodiment, first electronic component 3 forms a thyristor or SCR.

Semiconductor 1 optionally comprises at least one of a first resistor 13*a* electrically connected between first device terminal 2*a* and second primary region 3*b*, and a second resistor 13*b* electrically connected between second device terminal 2*b* and third primary region 3*c*.

During an ESD event resulting in a positive voltage at first device terminal 2*a*, a current path is provided from first device terminal 2*a* to second device terminal 2*b* when each of the junctions between first and second primary region 3*a*, 3*b*, first and second secondary region 4*a*, 4*b*, and third and fourth primary region 3*c*, 3*d* become forward-biased. At this stage, charge carriers are injected into the second and third primary region 3*b*, 3*c*. In particular, holes are injected from first primary region 3*a* into second primary region 3*b*, and electrons are injected from fourth primary region 3*d* into third primary region 3*c*. Then, once avalanche breakdown occurs at the junction between second and third primary region 3*b*, 3*c*, first electronic component 3 switches to its low-Ohmic on-state and discharges the ESD current.

Figure 7:
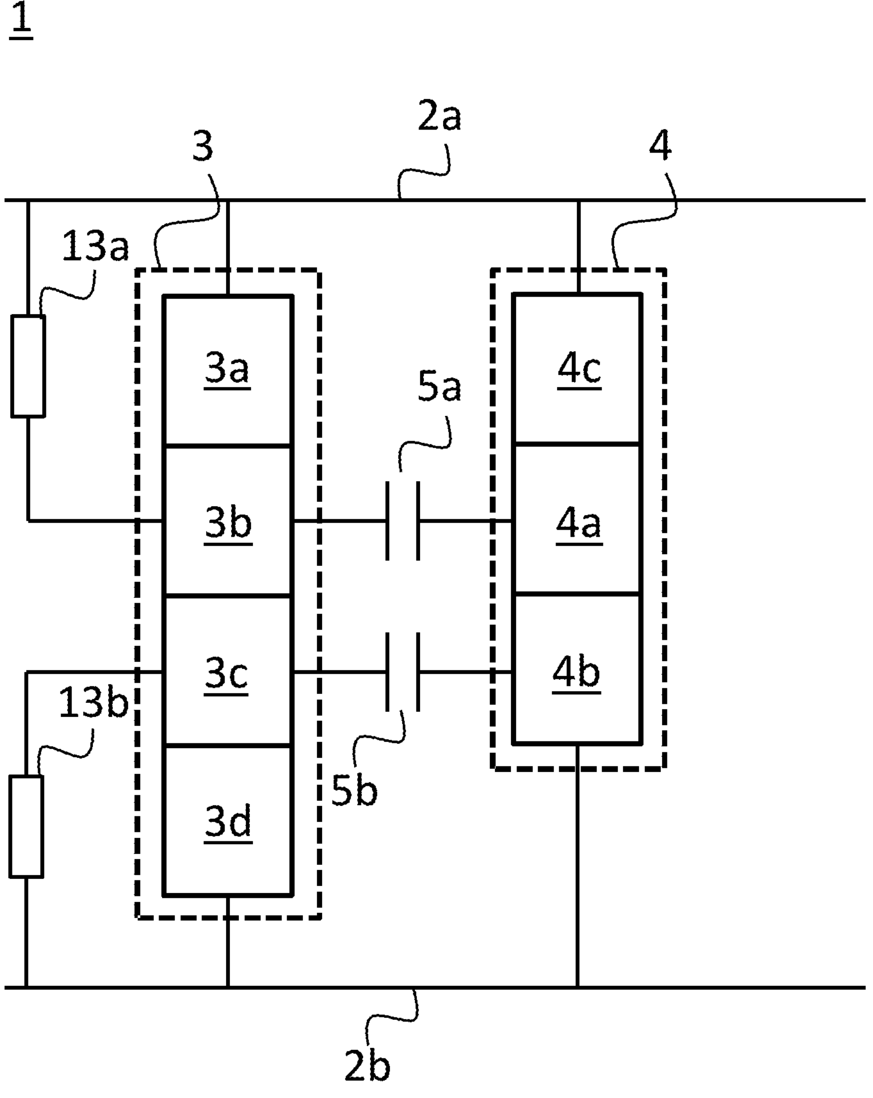
Figure 8:
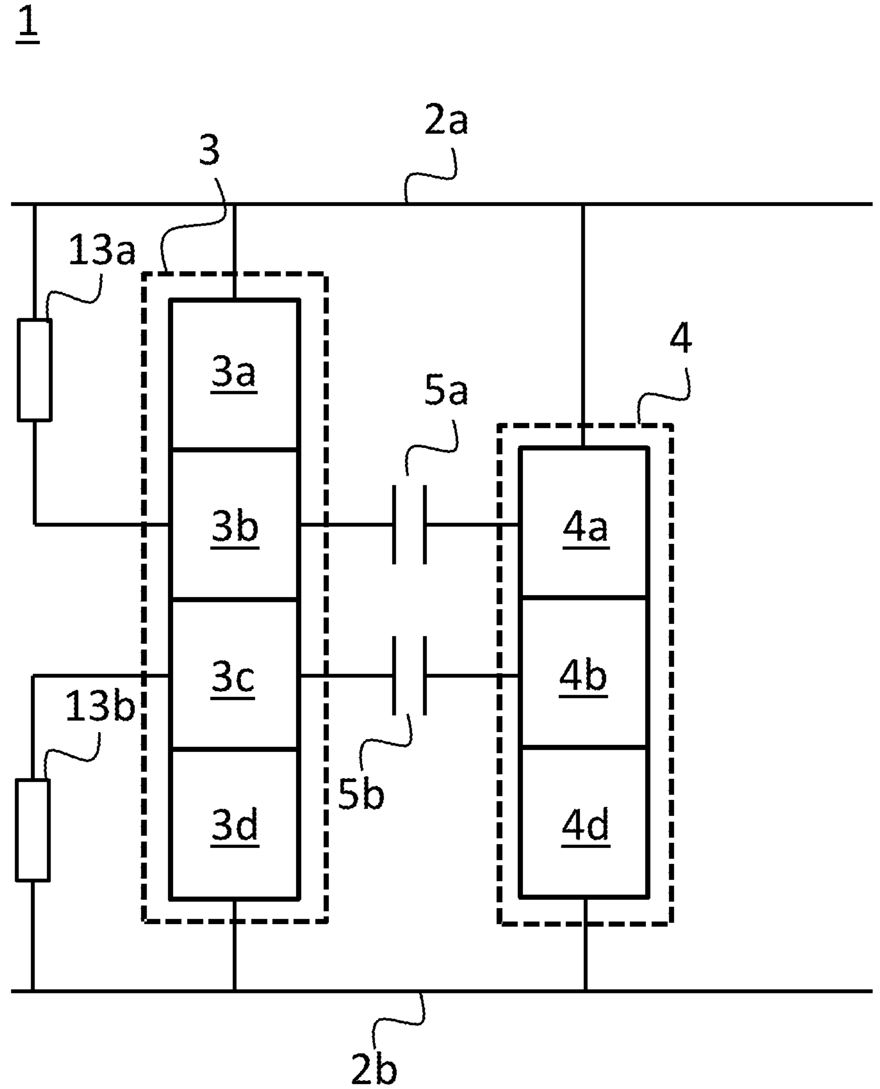

In FIGS. 7 and 8, first electronic component 3 forms a thyristor or SCR, and second electronic component 4 forms a BJT. For example, with respect to FIG. 6, second electronic component 4 comprises a third secondary region 4*c*, as shown in FIG. 7, or a fourth secondary region 4*d*, as shown in FIG. 8.

Referring to FIGS. 7 and 8, an operation of semiconductor device 1 for a voltage rise at first device terminal 2*a* may be similar to that of the device shown in FIG. 6. On the other hand, for a voltage rise at second device terminal 2*b*, the operation of semiconductor device 1 may be similar to that of the device shown in FIG. 3.

Figure 9:
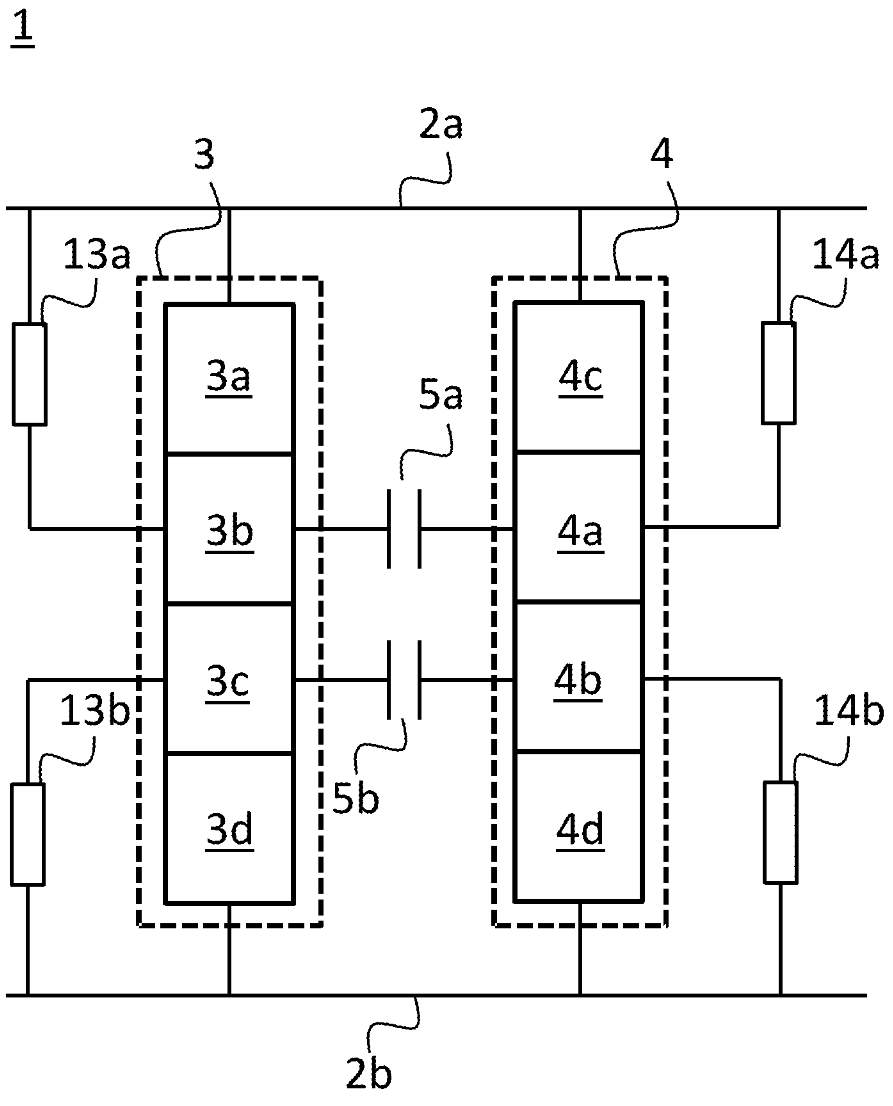

In FIG. 9, both first electronic component 3 and second electronic component 4 of semiconductor device 1 form a thyristor or SCR. In that case, second electronic component comprises both third secondary region 4*c* and fourth secondary region 4*d*. Furthermore, similarly to first electronic component 3, semiconductor 1 optionally comprises at least one of a third resistor 14*a* electrically connected between first device terminal 2*a* and first secondary region 4*a*, and a fourth resistor 14*b* electrically connected between second device terminal 2*b* and second secondary region 4*b*.

If an ESD event causes a voltage rise at first device terminal 2*a*, then first electronic component 3 will switch to its low-Ohmic on-state after avalanche breakdown occurs at the junction between second and third primary region 3*b*, 3*c* occurs. On the other hand, if the voltage rise due to an ESD event occurs at second device terminal, then second electronic component 4 will switch to its low-Ohmic on-state after avalanche breakdown occurs at the junction between first and second secondary region 4*a*, 4*b*.

In the above, the present disclosure has been explained using detailed embodiments thereof. However, it should be appreciated that the disclosure is not limited to these embodiments and that various modifications are possible without deviating from the scope of the present disclosure as defined by the appended claims.

What is claimed is:

1. A semiconductor device having a first device terminal and a second device terminal, the semiconductor device comprising a semiconductor body having a first electronic component integrated thereon;

wherein the first electronic component comprises:

a first primary region of a first charge type electrically connected to the first device terminal;

a second primary region of a second charge type arranged adjacent to the first primary region; and a third primary region of the first charge type arranged adjacent to the second primary region and being electrically connected to the second device terminal;

wherein the semiconductor device further comprises:

a second electronic component integrated on the semiconductor body and being spaced apart from the first electronic component, the second electronic component comprising a first secondary region of the first charge type and a second secondary region of the second charge type arranged adjacent to the first secondary region, wherein the second secondary region is electrically connected to the second device terminal; and a first capacitive element, a first terminal thereof being electrically connected to the second primary region, and a second terminal thereof being electrically connected to the first secondary region, wherein the first capacitive element is connected in between the second primary region and the first secondary region.

2. The semiconductor device according to claim 1, wherein the first electronic component forms a bipolar junction transistor (BJT), and/or wherein the second electronic component forms a diode.

3. The semiconductor device according to claim 2, further comprising a third electronic component integrated on the semiconductor body and being spaced apart from the first electronic component and the second electronic component;

wherein the third electronic component comprises a first tertiary region of the first charge type and a second tertiary region of the second charge type arranged adjacent to the first tertiary region;

wherein the first tertiary region is electrically connected to the second terminal of the first capacitive element, or wherein the semiconductor device further comprises a further first capacitive element having a first terminal thereof electrically connected to the second primary region and having a second terminal thereof electrically connected to the first tertiary region;

wherein the second tertiary region is electrically connected to the first device terminal; and wherein the third electronic component forms a diode.

4. The semiconductor device according to claim 2, wherein the second electronic component further comprises a third secondary region of the second charge type arranged adjacent to the first secondary region;

wherein the third secondary region is electrically connected to the first device terminal; and wherein the second electronic component forms a bipolar junction transistor (BJT).

5. The semiconductor device according to claim 1, further comprising a third electronic component integrated on the semiconductor body and being spaced apart from the first electronic component and the second electronic component;

wherein the third electronic component comprises a first tertiary region of the first charge type and a second tertiary region of the second charge type arranged adjacent to the first tertiary region;

wherein the first tertiary region is electrically connected to the second terminal of the first capacitive element, or wherein the semiconductor device further comprises a further first capacitive element having a first terminal thereof electrically connected to the second primary region and having a second terminal thereof electrically connected to the first tertiary region;

wherein the second tertiary region is electrically connected to the first device terminal; and wherein the third electronic component forms a diode.

6. The semiconductor device according to claim 1, wherein the second electronic component further comprises a third secondary region of the second charge type arranged adjacent to the first secondary region;

wherein the third secondary region is electrically connected to the first device terminal; and wherein the second electronic component forms a bipolar junction transistor (BJT).

7. The semiconductor device according to claim 6, wherein the second primary region comprises:

a first primary sub-region arranged adjacent to the first primary region;

a second primary sub-region arranged in between the first primary sub-region and the third primary region, wherein a dopant concentration of the first primary sub-region is less than that of the second primary sub-region and the first primary region;

wherein the first secondary region comprises:
a first secondary sub-region arranged adjacent to the third secondary region; and
a second secondary sub-region arranged in between the first secondary sub-region and the second secondary region, wherein a dopant concentration of the first secondary sub-region is less than that of the second secondary sub-region and the third secondary region;
wherein the first capacitive element is electrically connected between at least one of the first and second primary sub-region and at least one of the first and second secondary sub-region.

8. The semiconductor device according to claim 7, wherein the second primary region further comprises a third primary sub-region arranged in between the second primary sub-region and the third primary region, wherein a dopant concentration of the third primary sub-region is less than that of the second primary sub-region and the third primary region; and
wherein the first secondary region further comprises a third secondary sub-region arranged in between the second secondary sub-region and the second secondary region, wherein a dopant concentration of the third secondary sub-region is less than that of the second secondary sub-region and the second secondary region.

9. The semiconductor device according to claim 1, wherein the first electronic component further comprises a fourth primary region of the second charge type arranged adjacent to the third primary region, wherein the third primary region is electrically connected to the second device terminal through the fourth primary region;
wherein the semiconductor device further comprises a second capacitive element, a first terminal thereof being electrically connected to the third primary region, and a second terminal thereof being electrically connected to the second secondary region;
wherein the second secondary region is electrically connected to the second device terminal through the second capacitive element, the third primary region and the fourth primary region;
wherein the first electronic component forms a thyristor or a silicon controlled rectifier (SCR); and
wherein the semiconductor device comprises a first resistor electrically connected between the first device terminal and the second primary region, and/or a fourth resistor electrically connected between the second device terminal and the third primary region.

10. The semiconductor device according to claim 9, wherein the second electronic component forms a diode.

11. The semiconductor device according to claim 10, wherein the second electronic component further comprises a third secondary region of the second charge type arranged adjacent to the first secondary region; and
wherein the third secondary region is electrically connected to the first device terminal.

12. The semiconductor device according to claim 11, wherein the second electronic component further comprises a fourth secondary region of the first charge type arranged adjacent to the second secondary region, wherein the fourth secondary region is electrically connected to the second device terminal;
wherein the second electronic component forms a thyristor or SCR, the semiconductor device comprising a third resistor electrically connected between the first device terminal and the first secondary region, and/or a fourth resistor electrically connected between the second device terminal and the second secondary region.

13. The semiconductor device according to claim 9, wherein the second electronic component further comprises a third secondary region of the second charge type arranged adjacent to the first secondary region; and
wherein the third secondary region is electrically connected to the first device terminal.

14. The semiconductor device according to claim 9, wherein the second electronic component forms a bipolar junction transistor (BJT).

15. The semiconductor device according to claim 9, wherein the second electronic component further comprises a fourth secondary region of the first charge type arranged adjacent to the second secondary region, wherein the fourth secondary region is electrically connected to the second device terminal; and
wherein the second electronic component forms a bipolar junction transistor (BJT).

16. The semiconductor device according to claim 1, wherein the semiconductor body comprises a semiconductor substrate and an epitaxial layer on top of the semiconductor substrate; and
wherein the first electronic component, the second electronic component and a third electronic component are arranged in the epitaxial layer of the semiconductor body.

17. The semiconductor device according to claim 1, wherein the first charge type corresponds to a p-type or n-type doping, and wherein the second charge type corresponds to an n-type or p-type doping, respectively; and/or
wherein respective regions corresponding to the first electronic component, the second electronic component and/or a third electronic component are ion-implanted regions; and/or
wherein the semiconductor body is based on one technology selected from the group consisting of silicon, silicon carbide, gallium nitride, and gallium arsenide technology; and/or
wherein the first capacitive element and/or a further first capacitive element and/or a second capacitive element comprises a metal oxide semiconductor (MOS) capacitor.

18. An electrostatic discharge (ESD), protection device configured to be electrically connected to an electronic circuit and to protect the electronic circuit from ESD events;
wherein the ESD protection device comprises one or more semiconductor devices as defined in claim 1; and
wherein the ESD protection device a packaged device.

19. A device, comprising:
an electronic circuit integrated on a semiconductor body; and
one or more semiconductor devices as defined in claim 1;
wherein the one or more semiconductor devices are integrated in the semiconductor body and are connected to the electronic circuit to protect the electronic circuit from electrostatic discharge (ESD) events; and
wherein the device is a packaged device.

* * * * *